United States Patent [19]

Miura et al.

[11] Patent Number: 4,725,523

[45] Date of Patent: Feb. 16, 1988

[54] POSITIVE PHOTOSENSITIVE COMPOSITIONS WITH 1,2-NAPHTHOQUINONE DIAZIDE AND NOVOLAK RESIN PREPARED FROM α-NAPHTHOL AND P-CRESOL

[75] Inventors: Konoe Miura, Yokohama; Hideki Nagasaka, Yamato; Noriaki Takahashi, Yokohama; Tameichi Ochiai, Sagamihara; Ryuichiro Takasaki, Yokohama, all of Japan

[73] Assignee: Mitsubishi Chemical Industries Limited, Tokyo, Japan

[21] Appl. No.: 915,897

[22] Filed: Oct. 6, 1986

Related U.S. Application Data

[63] Continuation of Ser. No. 640,842, Aug. 15, 1984, abandoned.

[30] Foreign Application Priority Data

Aug. 30, 1983 [JP] Japan .................................. 58-158301
Feb. 20, 1984 [JP] Japan .................................. 59-30097

[51] Int. Cl.$^4$ ............................................. G03C 1/60
[52] U.S. Cl. .................................... 430/192; 430/323; 430/326; 528/129; 528/153
[58] Field of Search ............... 430/192, 190, 323, 326; 528/153, 129; 534/55 C

[56] References Cited

U.S. PATENT DOCUMENTS

| | | | |
|---|---|---|---|
| 3,647,443 | 3/1972 | Rauner et al. ........................ | 430/192 |
| 3,868,254 | 2/1975 | Wemmers ........................... | 430/192 |
| 4,173,470 | 11/1979 | Fahrenholtz et al. ............... | 430/192 |
| 4,250,242 | 2/1981 | Doering ............................. | 430/327 |
| 4,308,368 | 12/1981 | Kubo et al. ......................... | 430/192 |
| 4,377,631 | 3/1983 | Toukhy et al. ...................... | 430/192 |
| 4,404,357 | 9/1983 | Taylor et al. ....................... | 528/153 |
| 4,424,315 | 1/1984 | Taylor et al. ....................... | 528/153 |
| 4,439,516 | 3/1984 | Cernigliaro et al. ................ | 430/192 |
| 4,551,409 | 11/1985 | Gulla et al. ......................... | 430/197 |

*Primary Examiner*—Charles L. Bowers, Jr.
*Attorney, Agent, or Firm*—Oblon, Fisher, Spivak, McClelland & Maier

[57] ABSTRACT

Disclosed herein is a positive photosensitive composition comprising a 1,2-naphthoquinone diazide compound and a binder resin comprising a novolak resin containing as condensation components β-naphthol, or α-naphthol and p-cresol.

4 Claims, No Drawings

POSITIVE PHOTOSENSITIVE COMPOSITIONS WITH 1,2-NAPHTHOQUINONE DIAZIDE AND NOVOLAK RESIN PREPARED FROM α-NAPHTHOL AND P-CRESOL

This application is a continuation, of application Ser. No. 640,842, filed Aug. 15, 1984, now abandoned.

DETAILED DESCRIPTION OF INVENTION

This invention relates to positive radiation-sensitive compositions and in particular to radiation-sensitive positive photoresist compositions comprising a 1,2-naphthoquinone diazide compound and a novolak resin comprising as condensation components β-naphthol, or α-naphthol and p-cresol.

In recent years, positive photoresists using 1,2naphthoquinone diazide as a photosensitive material have come to be widely used in lithography processes such as integrated circuit fabrication. Conventional photoresists, however, did not have sufficient resistance to dry etching because they used cresol novolak resins or vinyl phenol polymers as a binder polymer. An object of the present invention is to improve the resistance to dry etching. This object is achieved with a photoresist composition comprising novolak resin comprising naphthol as condensation component. The photoresist has also an excellent sensitivity and very low film thickness loss at unexposed area after development.

The essential feature of the present invention resides in a positive photosensitive composition comprising a binder resin and a 1,2-naphthoquinone diazide compound, wherein the binder resin is a novolak resin comprising as condensation components β-naphthol, or α-naphthol and p-cresol.

The following is a detailed description of the present invention. The novolak resins should comprise as condensation components β-naphthol, or α-naphthol and p-cresol, and can also comprise other phenolic compounds which can condense with naphthols and aldehydes to give novolak type resin, provided that the photoresist using the resin has suitable properties. Examples are phenol, o-cresol, m-cresol, 2,3-xylenol, 2,5-xylenol, 3,5-xylenol, isopropyl phenol and m-propylphenol.

Novolak resins can be prepared by condensing naphthols together with the above-mentioned phenolic compounds if necessary with aldehyde according to conventional methods using known acidic catalyst. If β-naphthol is used, it is preferable that the β-naphthol content is 5-70 mole % and the phenolic compound content is 30-95 mole %. If β-naphthol content is less than 5 mole %, no remarkable improvement of resistance to dry etching is observed. On the other hand, if β-naphthol content is more than 70 mole %, the solubility of the resulting resin into the developing solution is very poor and only a photoresist with extremely low sensitivity can be obtained. A suitable novolak resin is obtained by the condensation of a mixture containing as the condensation components at least (a) 5-70 mole % of β-naphthol, and (b) 30-95 mole % of m-cresol, xylenol and/or phenol, with formaldehyde. A more suitable novolak resin is obtained by the condensation of a mixture containing as the condensation components at least (a) 10-40 mole % of β-naphthol, and (b) 60-90 mole % of m-cresol, 2,3-xylenol, 2,5-xylenol and/or 3,5-xylenol, with formaldehyde.

The molar ratio of m-cresol to xylenol is preferably between 1:3 and 3:1.

If α-naphthol is used, it is preferable that the α-naphthol content is 40-95 mole % and p-cresol content is 60-5 mole %. If α-naphthol is less than 40 mole %, no remarkable improvement of resistance to dry etching is shown. On the other hand if α-naphthol is more than 95 mole %, solubility in the developing solution is excessive whereby causing the film thickness loss at unexposed area after development.

Any aldehyde which forms a novolak resin by condensation with α-naphthol and p-cresol or β-naphthol and the phenolic compounds may be used. Aliphatic aldehydes such as formaldehyde or acetaldehyde, and aromatic aldehydes such as benzaldehyde, 9-antraldehyde or naphthaldehyde, may preferably be used. A mixture of several aldehydes may also be employed. The novolak resins obtained may, if necessary, be purified by the known methods such as reprecipitation etc.

As binder polymer the novolak resin in the present invention comprising α-naphthol and p-cresol or β-naphthol is not necessarily restricted to one kind of resin, and a blend of two or more may be used. A novolak resin comprising naphthols may also be employed in conjunction with a conventional cresol novolak resin. In this case, the content of the novolak resin comprising naphthol is more than 20% by weight and preferably 40-90% by weight of the total weight of the novolak resin, while the conventional cresol novolak resin is less than 80% by weight, and preferably 60-10% by weight of the total weight of the novolak resin.

β-Naphthol and α-naphthol have completely different effects on the solubility of the resulting novolak resin. The latter increases the solubility into developer and the former decreases. The content of α-naphthol is preferably more than 40 mole % in order to increase solubility in the developer. The particularly preferable content of β-naphthol, on the other hand, is less than 40 mole % in order to decrease solibility in the developer.

It is desirable that the weight-average molecular weight of novolak resin comprising β-naphthol, is in the range of 800-10,000. The weight-average molecular weight is defined as the value converted to polystyrene equivalent obtained by developing the resin dissolved in tetrahydrofuran as solvent in gel permeation chromatography using 2 columns (4 feet in total) of TSK-GEL GMH6 (a mixture of equivalent parts of G2H6, G3H6, G4H6 and G5H6; TSK-GEL is a trade mark, made by Toyo Soda Manufacturing Co., Ltd.). When the weight-average molecular weight is less than 800, the film thickness loss on the unexposed areas after development is large. On the other hand, when the weight-average molecular weight is greater than 10,000, development speed is too slow. The most preferable weight-average molecular weight is in the range of 1000-7000.

As 1,2-naphthoquinone diazide sensitizer, the compounds disclosed in Japanese Patent Application Laying Open No. 58-17112, advantageously esters of 1,2-naphthoquinone-2-diazide-5-sulfonic acid and 2,3,4-trihydroxybenzophenone are used. It is preferable that the amount of the compound in 1 g of the solid part of the photosensitive composition is within the range of 0.3-0.6 mmol as quinone diazide radical.

The photosensitive composition thus obtained is dissolved in a suitable solvent, and coated onto a substrate. As the solvent, a cellosolve solvent, such as methyl cellosolve, ethyl cellosolve, butyl cellosolve, methyl cellosolve acetate or ethyl cellosolve acetate; an ester solvent such as butyl acetate or amyl acetate; or a highly polar solvent such as dimethyl formamide or dimethyl sulfoxide may be mentioned. The resulting solution may also contain additives such as dyes, paint improvers, adhesion promoters and agents to increase sensitivity. The coating formed on a substrate is pattern-exposed with electromagnetic waves of wavelength below that of visible light, and then developed to form relief image of the photoresist. Following this, the substrate—for example the silicon oxide layer on silicon wafers—is subjected to dry etching. The photoresist compositions comprising the novolak resin of the present invention, show high resistance in comparison with prior art compositions to various dry etching processes—e.g. plasma etching, ion etching and reactive ion etching. The photoresist compositions according to the present invention much increase reliability of the dry etching process and, as a result, there is a great improvement in yields in semiconductor element production lines where the dry etching steps are carried out a number of times. The industrial significance of the present invention is therefore exceedingly high.

Novolak resins comprising β-naphthol as condensation component are superior to those comprising as condensation components α-naphthol and p-cresol in terms of storage stability of the photosensitive composition having these resins, and the novolak resins comprising β-naphthol are therefore to be preferred in particular.

We shall now give a more detailed description. The following syntheses, examples and typical reference examples will provide detailed description of the method of producing and utilizing the composition of the present invention, but the present invention is not limited to these examples provided that the essential features of the present invention are not overlooked.

Synthesis No. 1

A mixture of 57.6 g of β-naphthol (0.4 mol), 64.8 g of m-cresol (0.6 mol), 81.1 g of formalin (37% aqueous formaldehyde solution) and 1.84 g of oxalic acid dihydrate was heated at 100° C. for 1 hour. The reaction mixture was then washed with water at room temperature. After distilling off water at 130° C. under reduced pressure, 20 g of butyl cellosolve was added and the whole reaction mixture made solution. Condensation reaction was carried out at 180° C. for 30 min under reduced pressure, and the water formed and the butyl cellosolve were distilled off simultaneously to obtain a novolak resin. The weight-average molecular weight, as determined by gel permeation chromatography under the above conditions (abbreviated hereafter as Mw) was 1500.

Synthesis No. 2

A mixture of 28.8 g of β-naphthol (0.2 mol), 86.4 g of m-cresol (0.8 mol), 81.1 g of formalin (37% aqueous formaldehyde solution) and 1.84 g of oxalic acid dihydrate was heated at 100° C. for 50 min. The reaction mixture was then washed with water at room temperature and decanted, and after removing the water at 130° C. under reduced pressure, 30 g of butyl cellosolve was added and the whole reaction mixture made solution. Condensation reaction was carried out at 210° C. for 30 min under reduced pressure, and the water formed and butyl cellosolve were distilled off simultaneously to obtain a novolak resin having Mw of 4500.

Synthesis No. 3

A mixture of 48.0 g of β-naphthol (0.333 mol), 36.0 g of m-cresol (0.333 mol), 40.7 g of 2,5-xylenol (0.333 mol), 81.1 g of formalin (37% aqueous formaldehyde solution) and 1.87 g of oxalic acid dihydrate was heated at 100° C. for 2 hours. After distilling off water at 150° C. under reduced pressure, 24 g of butyl cellosolve was added. The resulting solution was heated at 200° C. for 30 min, condensation reaction was carried out at 200° C. under reduced pressure, and water and butyl cellosolve were distilled off simultaneously to obtain a novolak resin having Mw of 1550.

Synthesis No. 4

A mixture of 7.2 g of β-naphthol (0.05 mol), 10.8 g of m-cresol (0.1 mol), 12.2 g of 2,5-xylenol (0.1 mol), 20.3 g of formalin (37% aqueous formaldehyde solution) and 0.529 g of oxalic acid dihydrate was heated at 100° C. for 1 hour, followed by further heating at 130° C. for 1 hour. After distilling off water at 150° C. under reduced pressure, 6 g of butyl cellosolve was added. The resulting solution was heated at 210° C. for 20 min. and water and butyl cellosolve were distilled off simultaneously at the same temperature, condensation reaction being carried out during the time. The novolak resin thus obtained has Mw of 3000.

Synthesis No. 5

A mixture of 21.6 g of β-naphthol (0.15 mol), 9.4 g of phenol (0.1 mol), 20.3 g of formalin (37% aqueous formaldehyde solution), 0.93 g of oxalic acid dihydrate and 12 g of butyl cellosolve was heated at 100° C. for 1 hour, followed by further heating at 130° C. for 1 hour. After adding 0.93 g of oxalic acid dihydrate, the resulting mixture was heated at 130° C. for 1 hour. Condensation reaction was then carried out at 180° C. for 1 hour under reduced pressure, water and butyl cellosolve were distilled off simultaneously, followed by further heating at 210° C. for 20 min under reduced pressure to obtain a novolak resin having Mw of 1200.

Reference Synthesis No. 1

A mixture of 8.64 g of α-naphthol, 4.32 g of p-cresol, 7.30 g of formalin (37% aqueous formaldehyde solution) and 0.15 g of oxalic acid dihydrate was heated at 80° C. for 45 min, and then at 100° C. for 25 min. The reaction mixture was washed with water at room temperature, and then condensation reaction was carried out under reduced pressure, the temperature being raised from 140° C. to 200° C. over a period of 1 hour 20 min. A novolak resin having Mw of 2000 was obtained.

Reference Synthesis No. 2

A mixture of 28.8 g of α-naphthol (0.2 mol), 86.4 g of m-cresol (0.8 mol), 81.1 g of formalin (37% aqueous formaldehyde solution and 1.84 g of oxalic acid dihydrate was heated at 100° C. for 1 hour. The reaction mixture was then washed with water at room temperature, and condensation reaction was carried out under reduced pressure at 180° C. for 1 hour to obtain a novolak resin having Mw of 4000.

EXAMPLES 1-5 AND REFERENCE EXAMPLES 1,2

10 g of the novolak resin obtained in Synthesis Nos. 1-5 and Reference Synthesis Nos. 1,2, was dissolved in ethyl cellosolve acetate together with 1.67 g of triester of 1,2-naphthoquinone-2-diazide-5-sulfonic acid and 2,3,4-trihydroxybenzophenone. The solution was spin-coated onto silicon wafers with a 0.5μ layer of silicon oxide so as to form a film of 1.0 μm thickness. The thus treated wafers were pre-baked at 90° C. for 30 min, exposed by a Nippon Optical Wafers Stepper NSR-1505, developed at 25° C. for 1 min in a developer solution (NMD-3) (made by Tokyo Ohka Kogyo Inc.), and then rinsed well with water for 1 min. The exposure time required to reproduce 2μ line and space of the mask pattern, as measured with a scanning electron microscope and a Dimension Analyzer (Lampas) (made by Nippon Optical Industries Inc.), was determined, and this value was defined as the sensitivity.

The proportion of film remaining on the unexposed parts after development, was also determined.

The image-forming surface thus obtained was subjected to dry etching in a plasma etching device (made by Plasma Thermo Corp.) Etching was carried out, using a gaseous mixture of 5% oxygen ($O_2$) and 95% tetrafluoromethane ($CF_4$), at 750μ Torr and 40° C. for 20 min, and the difference (d) of the thicknesses of photoresist film before and after etching, was measured.

For comparison purposes, a reference sample prepared by the same procedures using novolak resin synthesized from m-cresol (70 mole %) and p-cresol (30 mole %) was subjected to dry etching at the same time in every experiment. The difference of the thicknesses of the photoresist film before and after etching was measured, and taken to be $d_{ref}$. The ratio $d_{ref}/d$ was then taken as an indication of resistance to dry etching. The greater ratio $d_{ref}/d$ shows the more excellent resistance to dry etching. Storage stability was evaluated by comparing the sensitivity of the photoresist stored at 40° C. for 2 weeks (the conditions correspond to a long-term storage at room temperature) with that before the storage. The results are shown in Table 1. As seen from the Table 1, since the ratio $d_{ref}/d$ of the resist film using the photoresist composition of the present invention is greater than 1, the resist film has excellent resistance to dry etching, and also has good conservation property.

was carried out under reduced pressure the temperature being raised from 140° C. to 200° C. over a period of 1 hour 20 min.

10 g of the novolak resin obtained was dissolved in 24 g of ethyl cellosolve acetate, together with 1.67 g of triesters of 1,2-naphthoquinone-2-diazide-5-sulfonic acid and 2,3,4-trihydroxybenzophenone. The solution was spin-coated onto silicon wafers with a 0.5μ layer of silicon oxide so as to form a film of 1.0 μm thickness. The thus treated wafers were pre-baked at 90° C. for 30 min, exposed by a step-and-repeat exposure equipment (DSW) (made by GCA Corp.), developed at 25° C. for 1 min in developer solution (NMP-3) (made by Tokyo Ohka Kogyo Inc.), and then rinsed with water for 1 min. The image formed was evaluated with a scanning electron microscope and a Dimension Analyzer (Lampas) (made by Nippon Optical Industries Inc.) The lithographically useful sensitivity was 0.15 seconds (exposure time necessary to reproduce 1μ line and space of the mask pattern), proportion of film remaining was 86% (proportion of film remaining on unexposed parts after development), and the resolution was finer than 0.8 μm.

The image-forming surface thus obtained was subjected to dry etching in a plasma etching device (made by Plasma Thermo Corp.). Etching was carried out, using a gaseous mixture of 5% oxygen ($O_2$) and 95% tetrafluoromethane ($CF_4$) at 750 μ Torr and 40° C. for 20 min, and the difference (d) of the thicknesses of the photoresist film before and after etching, was measured.

For comparison purposes, a reference sample prepared by the same procedures using novolak resin synthesized from m-cresol (70 mole %) and p-cresol (30 mole %) was subjected to dry etching at the same time in every experiment. The difference of the thicknesses of the photoresist film before and after etching was measured, and taken to be $d_{ref}$. The ratio $d_{ref}/d$ was found to be 1.3, i.e. the difference (d) of the thicknesses of the photoresist film before and after etching for the resist film using the photoresist compositions of the present invention was less than $d_{ref}$ for the resist made

TABLE 1

| | | Properties of photoresist solution after immediately preparing | | | | Storage stability (sensitivity variation) |
|---|---|---|---|---|---|---|
| | Novolak resin | Sensitivity (mscc) | Proportion of film remaining (%) | Resolution | $d_{ref}/d$ | |
| Example 1 | Synthesis No. 1 resin | 180 | 90 | Good | 1.4 | Less than 5% |
| Example 2 | Synthesis No. 2 resin | 180 | 90 | Good | 1.3 | Less than 5% |
| Example 3 | Synthesis No. 3 resin | 100 | 92 | Good | 1.4 | Less than 5% |
| Example 4 | Synthesis No. 4 resin | 100 | 95 | Good | 1.5 | Less than 5% |
| Example 5 | Synthesis No. 5 resin | 160 | 88 | Good | 1.3 | Less than 5% |
| Reference Example 1 | Reference synthesis No. 1 resin | 180 | 90 | Good | 1.3 | 65% |
| Reference Example 2 | Reference synthesis No. 2 resin | No image | 0 | — | — | — |

EXAMPLE No. 6

A mixture of 8.64 g of α-naphthol, 4.32 g of p-cresol, 7.30 g of formalin (37% aqueous formaldehyde solution) and 0.15 g of oxalic acid dihydrate was heated at 80° C. for 45 min, followed by further heating at 100° C. for 25 min. The reaction mixture was then washed with water at room temperature, and condensation reaction from a novolak resin containing no napthol component. Accordingly, the resist film using the photoresist composition of the present invention has excellent resistance to dry etching.

EXAMPLE No. 7

A novolak resin was synthesized from a mixture of 50.4 g of α-naphthol, 16.2 g of p-cresol, 36.5 g of formalin (37% aqueous formaldehyde solution) and 0.75 g of oxalic acid dihydrate according to the method of Example No. 6.

The novolak resin was re-precipitated by dissolving in 180 g of acetone and dropping in 180 g of water, and this treatment was repeated. After drying under reduced pressure, the novolak resin was obtained.

An image evaluation was carried out using the thus obtained resin according to the method of Example No. 6, and similar results were obtained. The resistance to dry etching was also evaluated, and $d_{ref}/d$ was found to be 1.4.

EXAMPLE No. 8

A novolak resin was synthesized from a mixture of 11.52 g of α-naphthol, 2.16 g of p-cresol, 7.3 g of formalin and 0.15 g of oxalic acid dihydrate according to the method of Example No 7, and evaluated in a similar manner to Example No. 7. The image evaluation gave similar results to those of Example No. 6, and $d_{ref}/d$ was found to be 1.4.

EXAMPLE No. 9

A novolak resin was synthesized from mixture of 10.08 g of α-naphthol, 4.08 g of m-isopropyl phenol, 7.3 g of formalin and 0.15 g of oxalic acid dihydrate according to the method of Example No. 7, and evaluated in a similar manner to Example No. 7. The image evaluation gave similar results to those of Example No. 6 and $d_{ref}/d$ was found to be 1.3.

EXAMPLE No. 10

A novolak resin was synthesized from a mixture of 5.76 g of α-naphthol, 1.08 g of m-cresol, 5.40 g of p-cresol, 7.3 g of formalin and 0.15 g of oxalic acid dihydrate according to the method of Example No. 7, and evaluated in a similar manner to Example No. 7. The image evaluation gave similar results to those of Example No. 6, and $d_{ref}/d$ was found to be 1.2.

EXAMPLE No. 11

A blend of 7 g of the novolak resin synthesized in Example No. 7 and 3 g of a novolak resin synthesized from m-cresol (60 mole %) and p-cresol (40 mole %), and formaldehyde in place of the 10 g of novolak resin synthesized in Example No. 6 were evaluated according to the method of Example No. 6.

The image evaluation gave similar results to those of Example No. 6, and $d_{ref}/d$ was found to be 1.3.

EXAMPLE No. 12

A blend of 5 g of the novolak resin synthesized in Example No. 8 and 5 g of a novolak resin synthesized from m-cresol (60 mole %) and p-cresol (40 mole %) and formaldehyde in place of the 10 g of novolak resin synthesized in Example No. 6 were evaluated according to the method of Example No. 6. The image evaluation gave similar results to those of Example No. 6, and $d_{ref}/d$ was found to be 1.3.

EXAMPLE No. 13

A blend of 3 g of the novolak resin synthesized in Example No. 8 and 7 g of a novolak resin synthesized from m-cresol (60 mole %) and p-cresol (40 mole %) and formaldehyde in place of the 10 g of novolak resin synthesized in Example No. 6 were evaluated according to the method of Example No. 6. The image evaluation gave similar results to those of Example No. 6, and $d_{ref}/d$ was found to be 1.2.

EXAMPLE No. 14

A novolak resin was synthesized as described in Example No. 6, except for using 4.90 g of formalin and adding 4.2 g of 9-antraldehyde. It was evaluated according to the method of Example No. 6, and $d_{ref}/d$ was found to be 1.5.

EXAMPLE No. 15

A novolak resin was synthesized as described in Example No. 14, except for using 3.2 g of β-naphthaldehyde in place of 9-antraldehyde. An evaluation was carried out according to Example No. 14, and $d_{ref}/d$ was found to be 1.4.

What is claimed is:

1. A positive photosensitive composition which exhibits good resistance to dry etching and which exhibits good sensitivity and low film thickness loss in unexposed areas upon development, consisting essentially of:
    an admixture of a photosensitive 1,2-naphthoquinone diazide compound and a bindingly effective amount of a novolak resin prepared by condensing an aliphatic aldehyde or an aromatic aldehyde selected from the group consisting of benzaldehyde, 9-anthraldehyde and naphthaldehyde with a phenolic component of a mixture of 40-95 mole % α-naphthol and 5-60 mole % p-cresol.
2. The composition according to claim 1, wherein the aliphatic aldehyde is formaldehyde or acetaldehyde.
3. The composition according to claim 1, wherein the weight-average molecular weight of the novolak resin is in the range of from 800 to 10,000.
4. The composition according to claim 1, wherein the 1,2-naphthoquinone diazide compound is the ester of 1,2-naphthoquinone-2-diazide-5-sulfonic acid and 2,3,4-trihydroxybenzophenone.

* * * * *